United States Patent
Zhang et al.

(10) Patent No.: US 12,342,535 B2
(45) Date of Patent: Jun. 24, 2025

(54) MEMORY FORMING METHOD AND MEMORY

(71) Applicant: CHANGXIN MEMORY TECHNOLOGIES, INC., Hefei (CN)

(72) Inventors: Lingguo Zhang, Hefei (CN); Lintao Zhang, Hefei (CN); Thomas Jongwan Kwon, Hefei (CN); Xiangui Zhou, Hefei (CN); Xu Liu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 609 days.

(21) Appl. No.: 17/601,494

(22) PCT Filed: Sep. 15, 2020

(86) PCT No.: PCT/CN2020/115398
§ 371 (c)(1),
(2) Date: Oct. 5, 2021

(87) PCT Pub. No.: WO2021/258561
PCT Pub. Date: Dec. 30, 2021

(65) Prior Publication Data
US 2022/0328494 A1    Oct. 13, 2022

(30) Foreign Application Priority Data
Jun. 22, 2020   (CN) .......................... 202010576479.9

(51) Int. Cl.
H10B 12/00   (2023.01)
(52) U.S. Cl.
CPC ........... *H10B 12/485* (2023.02); *H10B 12/30* (2023.02)
(58) Field of Classification Search
CPC .... H10B 12/02; H10B 12/30; H10B 12/0355; H10B 12/485; H10B 12/482;
(Continued)

(56) References Cited

U.S. PATENT DOCUMENTS

| | | | |
|---|---|---|---|
| 2004/0137743 A1* | 7/2004 | Chung | .............. H01L 21/76816 257/E21.252 |
| 2008/0081413 A1 | 4/2008 | Lee et al. | |

(Continued)

FOREIGN PATENT DOCUMENTS

| | | |
|---|---|---|
| CN | 101043035 A | 9/2007 |
| CN | 101552276 A | 10/2009 |

(Continued)

OTHER PUBLICATIONS

ISR for International Application PCT/CN2020/115398 mailed Mar. 17, 2021.

(Continued)

*Primary Examiner* — Joshua Benitez Rosario
*Assistant Examiner* — John Lin
(74) *Attorney, Agent, or Firm* — Kilpatrick Townsend & Stockton LLP

(57) ABSTRACT

Some embodiments of the present application provide a memory forming method and a memory. The method includes: providing a substrate including at least word line structures and active regions, and bottom dielectric layers and bit line contact layers located on a top surface of the substrate, the bottom dielectric layer having bit line contact openings exposing the active regions in the substrate, and the bit line contact layers covering the bottom dielectric layers and filling the bit line contact openings; etching part of the bit line contact layers to form the bit line contact layers of different heights; forming conductive layers, top surfaces of the conductive layers being at the same height in a direction perpendicular to an extension direction of the word line structures; and the top surfaces of the conductive layers being at different heights in the extension direction of the word line structures; forming top dielectric layers.

6 Claims, 6 Drawing Sheets

(58) Field of Classification Search
CPC .............. H01L 21/0274; H01L 21/3213; H01L 21/32139; H01B 12/02; H01B 12/30; H01B 12/0355; H01B 12/485; H01B 12/482
See application file for complete search history.

(56) References Cited

U.S. PATENT DOCUMENTS

| | | | |
|---|---|---|---|
| 2011/0159686 A1* | 6/2011 | Jung | ................ H01L 21/0337 257/E21.232 |
| 2011/0195551 A1* | 8/2011 | Kim | ................ H10B 12/315 438/270 |
| 2011/0278668 A1 | 11/2011 | Kim | |
| 2012/0040528 A1 | 2/2012 | Kim | |
| 2019/0139963 A1 | 5/2019 | Hong et al. | |
| 2021/0091086 A1 | 3/2021 | Hong et al. | |

FOREIGN PATENT DOCUMENTS

| | | | |
|---|---|---|---|
| CN | 102148197 | A | 8/2011 |
| CN | 107910330 | A | 4/2018 |
| CN | 208368506 | U | 1/2019 |
| CN | 109524383 | A | 3/2019 |
| CN | 110556359 | A | 12/2019 |
| KR | 101610831 | B1 | 4/2016 |
| TW | I291700 | B | 12/2007 |

OTHER PUBLICATIONS

International Search Report and Written Opinion for Application No. PCT/CN2020/115396, mailed on Mar. 5, 2021, 10 pages.
Supplementary European Search Report in the European application No. 20942413.4, mailed on Nov. 29, 2022.
English translation of the Written Opinion of the International Search Authority in the international application No. PCT/CN2020/115398, mailed on Mar. 17, 2021.
English translation of the Written Opinion of the International Search Authority in the international application No. PCT/CN2020/115396, mailed on Mar. 5, 2021.
Korean Intellectual Property Office, Office Action Issued in Application No. 10-2022-7038285, Oct. 23, 2024, 7 pages.

* cited by examiner

Section of dashed line 30:

Section of dashed line 31:

MEMORY FORMING METHOD AND MEMORY

CROSS-REFERENCE TO RELATED APPLICATIONS

This application is a national stage entry of International Patent Application No. PCT/CN2020/115398, filed on Sep. 15, 2020, which claims priority to Chinese Patent Application No. 202010576479.9, filed on Jun. 22, 2020. The entire content of the above-referenced patent applications are incorporated herein by reference.

TECHNICAL FIELD

The present application relates to the field of semiconductor technologies, in particular to a memory forming method and a memory.

BACKGROUND

With constant decrease in a feature size and a line width of a dynamic random access memory (DRAM), spacing between adjacent bit line structures becomes smaller and smaller. The smaller spacing between adjacent bit line structures may lead to continuous increase of parasitic capacitance between the adjacent bit line structures, which affects the operation efficiency of the DRAM.

SUMMARY

Embodiments of the present application provide a memory forming method, including: providing a substrate including at least word line structures and active regions, and bottom dielectric layers and bit line contact layers located on a top surface of the substrate, the bottom dielectric layer having bit line contact openings exposing the active regions in the substrate, and the bit line contact layers covering the bottom dielectric layers and filling the bit line contact openings; etching part of the bit line contact layers to form the bit line contact layers of different heights; forming conductive layers on top surfaces of the bit line contact layers, top surfaces of the conductive layers being at the same height in a direction perpendicular to an extension direction of the word line structures; and the top surfaces of the conductive layers being at different heights in the extension direction of the word line structures; forming top dielectric layers on the top surfaces of the conductive layers; and sequentially etching part of the top dielectric layers, the conductive layers, and the bit line contact layers to form discrete bit line structures.

The embodiments of the present application further provide a memory, including: a substrate including at least word line structures and active regions; bottom dielectric layers located at the top of the substrate, the bottom dielectric layers having bit line contact openings exposing the active regions in the substrate; and discrete bit line structures, top surfaces of the bit line structures being at the same height, and the bit line structures including: bit line contact layers located at the top of the bottom dielectric layers and the bit line contact openings, conductive layers located at the top of the bit line contact layers, and top dielectric layers located at the top of the conductive layers; wherein the conductive layers in the same bit line structure are at the same height in an extension direction of the bit line structures, and the conductive layers in adjacent bit line structures are at different heights in the extension direction of the word line structures.

BRIEF DESCRIPTION OF THE DRAWINGS

One or more embodiments are shown by way of example, and not by limitation, in the figures of the accompanying drawings. The figures in the drawings are not to scale, unless otherwise stated.

DETAILED DESCRIPTION OF THE EMBODIMENTS

Figure 1:
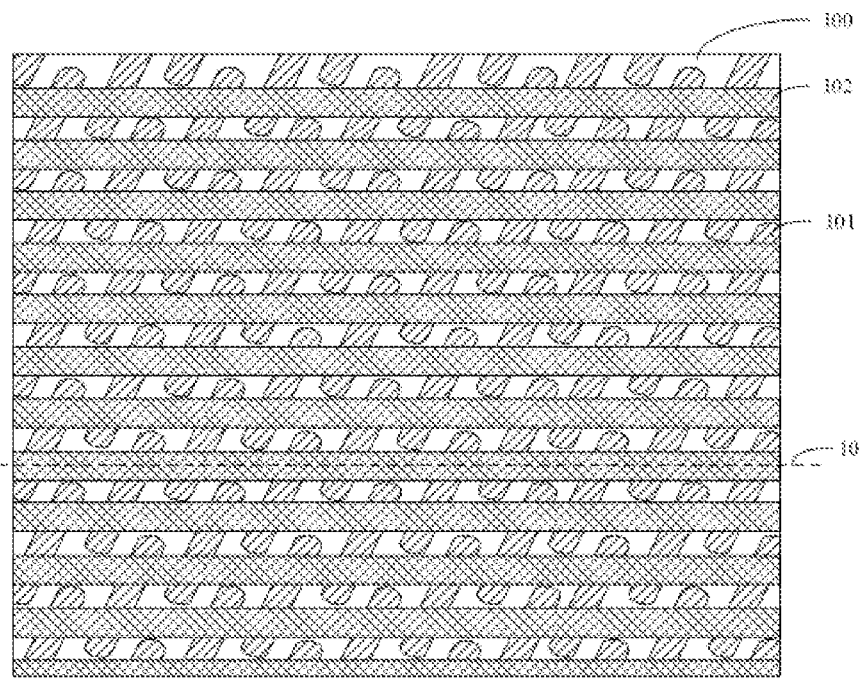
FIG. 1 illustrates a schematic structural diagrams of one embodiment corresponding to steps of a memory forming method.

With constant decrease in a feature size and a line width of a DRAM, spacing between adjacent bit line structures becomes smaller and smaller. The smaller spacing between adjacent bit line structures may lead to continuous increase of parasitic capacitance between the adjacent bit line structures, which affects a saturation current in a DRAM array region and then affects the operation efficiency of the DRAM.

In order to make the present application clearer, some embodiments of the present application are described in further detail below with reference to the accompanying drawings and embodiments. It should be understood that specific embodiments described herein are intended only to interpret the present application and are not intended to limit the present application.

Embodiment described herein provide a method of a memory forming, including: providing a substrate including at least word line structures and active regions, and bottom dielectric layers and bit line contact layers located on a top surface of the substrate, the bottom dielectric layer having bit line contact openings exposing the active regions in the substrate, and the bit line contact layers covering the bottom dielectric layers and filling the bit line contact openings; etching part of the bit line contact layers to form the bit line contact layers of different heights; forming conductive layers on top surfaces of the bit line contact layers, top surfaces of the conductive layers being at the same height in a direction perpendicular to an extension direction of the word line structures; and the top surfaces of the conductive layers being at different heights in the extension direction of the word line structures forming top dielectric layers on the top surfaces of the conductive layers; and sequentially etching part of the top dielectric layers, the conductive layers, and the bit line contact layers to form discrete bit line structures.

FIG. 1 to FIG. 12 are schematic structural diagrams of one embodiment corresponding to steps of a memory forming method.

Referring to FIG. 1 to FIG. 5, a substrate 100 is provided. The substrate 100 includes at least word line structures 102 and active regions 101, and bottom dielectric layers 110 and bit line contact layers 120 located on a top surface of the substrate 100. The dielectric layers have bit line contact openings 111. The bit line contact openings 111 expose the active regions 101 in the substrate 100. The bit line contact layers 120 cover the bottom dielectric layers 110 and fill the bit line contact openings 111.

Referring to FIG. 1, a substrate 100 is provided. The substrate 100 includes at least word line structures 102 and active regions 101.

FIG. 1 shows an extension direction 10 of the word line structures, that is, the dashed line 10 in the figure.

A plurality of active regions 101 are spaced parallel to each other, and for the active regions 101 in column i and the active regions 101 in column i+3, different active regions 101 are located at the same horizontal position in a direction perpendicular to the extension direction 10 of the word line structures. The active regions 101 in column i and the active regions 101 in adjacent columns (column i+1 and column i−1) are located at different horizontal positions in the direction perpendicular to the extension direction 10 of the word line structures. Middle parts of the active regions 101 separated by the word line structures 102 arranged alternately are bit line contact points, which are used for connecting bit line structures subsequently formed.

It should be noted that the substrate 100 further includes other memory structures in addition to the word line structures 102 and the active regions 101, such as shallow trench isolation structures. Since the other memory structures do not involve the core technology of the present application, they are not described in detail herein. Those skilled in the art can understand that the substrate 100 further includes other memory structures in addition to the word line structures 102 and the active regions 101, which are used for normal operation of a memory.

The substrate 100 may be made of sapphire, silicon, silicon carbide, gallium arsenide, aluminum nitride, zinc oxide, or the like. In the present embodiment, the substrate 100 is formed from a silicon material. It is understood by those skilled in the art that the use of the silicon material as the substrate 100 is intended to facilitate the understanding of subsequent formation methods by those skilled in the art and does not constitute any limitation. In an actual application process, an appropriate substrate material can be selected as required.

Referring to FIG. 1 to FIG. 5, bottom dielectric layers 110 and bit line contact layers 120 are formed on a top surface of the substrate 100. The bottom dielectric layers 110 have bit line contact openings 111. The bit line contact openings 111 expose the active regions 101 in the substrate 100. The bit line contact layers 120 cover the bottom dielectric layers 110 and fill the bit line contact openings 111.

Figure 2:
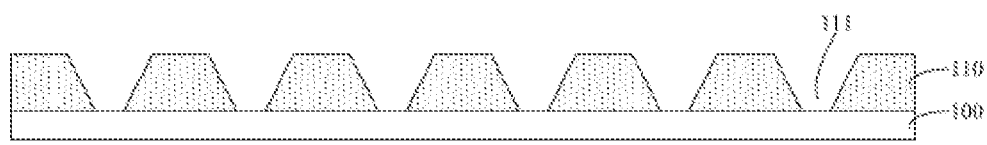
FIG. 2 illustrates a schematic structural diagrams of one embodiment corresponding to steps of a memory forming method.

Referring to FIG. 2, bottom dielectric layers 110 are formed on a top surface of the substrate 100. The bottom dielectric layers 110 have bit line contact openings 111. The bit line contact openings 111 are configured to expose the active regions 101 in the substrate 100. Specifically, the bit line contact openings 111 are configured to expose bit line contact points, that is, expose middle parts of the active regions 101 separated by the word line structures 102.

The bottom dielectric layers 110 are configured to isolate the bit line structures 200 at positions of non-bit line contact points from the active regions 101. In the present embodiment, the bottom dielectric layer is made of silicon nitride. In other embodiments, the bottom dielectric layer may also be made of an insulating material such as silicon oxide or silicon nitride.

Figure 3:
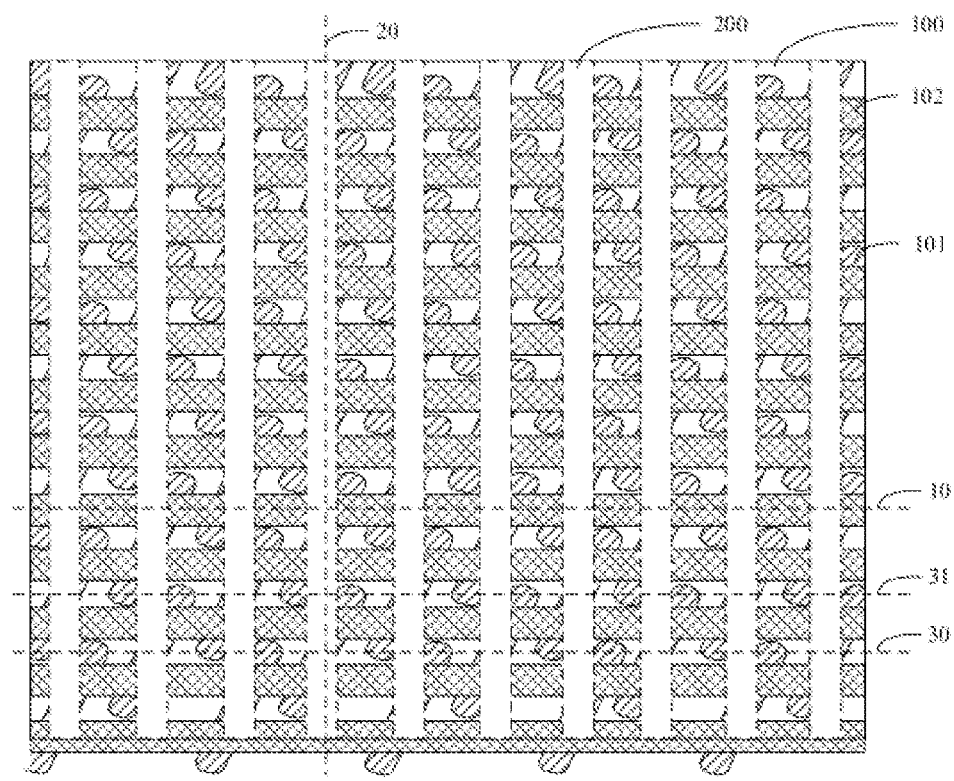
FIG. 3 illustrates a schematic structural diagrams of one embodiment corresponding to steps of a memory forming method.

Referring to FIG. 3, FIG. 3 is a schematic top view of the substrate 100. On the basis of the bottom dielectric layers 110 formed in FIG. 2, FIG. 3 shows positions where bit line structures 200 are required to be subsequently formed. FIG. 3 shows an extension direction 20 of the bit line structures, that is, the dashed line 20 in the figure. The bit line structures 200 are connected to bit line contact points of a column of active regions 101.

Figure 4:
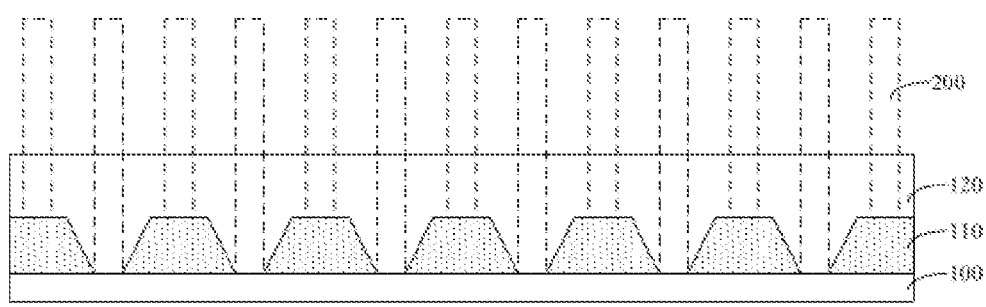
FIG. 4 illustrates a schematic structural diagrams of one embodiment corresponding to steps of a memory forming method.

Referring to FIG. 4, bit line contact layers 120 are formed on a top surface of the substrate 100. The bit line contact layers 120 cover the bottom dielectric layers 110 and fill the bit line contact openings 111. FIG. 4 shows positions where bit line structures 200 are required to be subsequently formed. The bit lines connected to the active regions 101 and the bit lines located on the bottom dielectric layers 110 are arranged alternately in any section along the extension direction 10 of the word line structures.

In some embodiments, the bit line contact layers 120 are made of a polysilicon material, which is used for the bit lines structure 200 subsequently formed to connect the active regions 101 in the substrate 100 through the bit line contact openings 111.

Referring to FIG. 1 to FIG. 8, part of the bit line contact layers 120 are etched to form bit line contact layers 121 of different heights.

The reason for forming the bit line contact layers 121 of different heights is as follows: after the bit line contact layers 121 are used for subsequently forming conductive layers, the conductive layers are at different heights.

Figure 5:
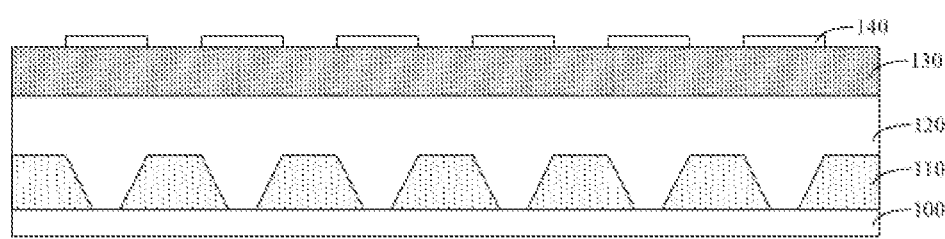
FIG. 5 illustrates a schematic structural diagrams of one embodiment corresponding to steps of a memory forming method.

Specifically, referring to FIG. 5, photolithographic mask layers 130 are formed on the top surfaces of the bit line contact layers 120, and photoresists 140 are formed on top surfaces of the photolithographic mask layers 130.

Figure 6:
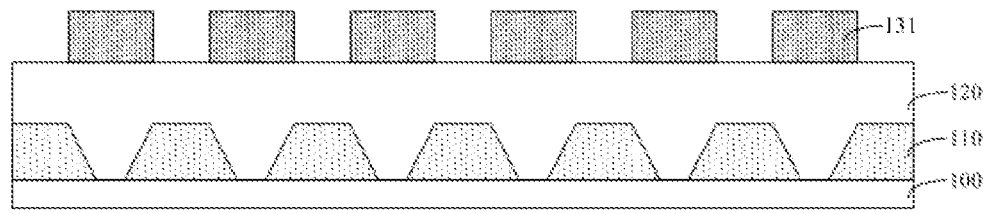
FIG. 6 illustrates a schematic structural diagrams of one embodiment corresponding to steps of a memory forming method.

Referring to FIG. 6, the photolithographic mask layers 130 are patterned, and patterns 131 arranged at intervals are formed in the direction perpendicular to the extension direction 10 of the word line structures. The patterns 131 arranged at intervals are extended strips arranged at intervals.

Figure 7:
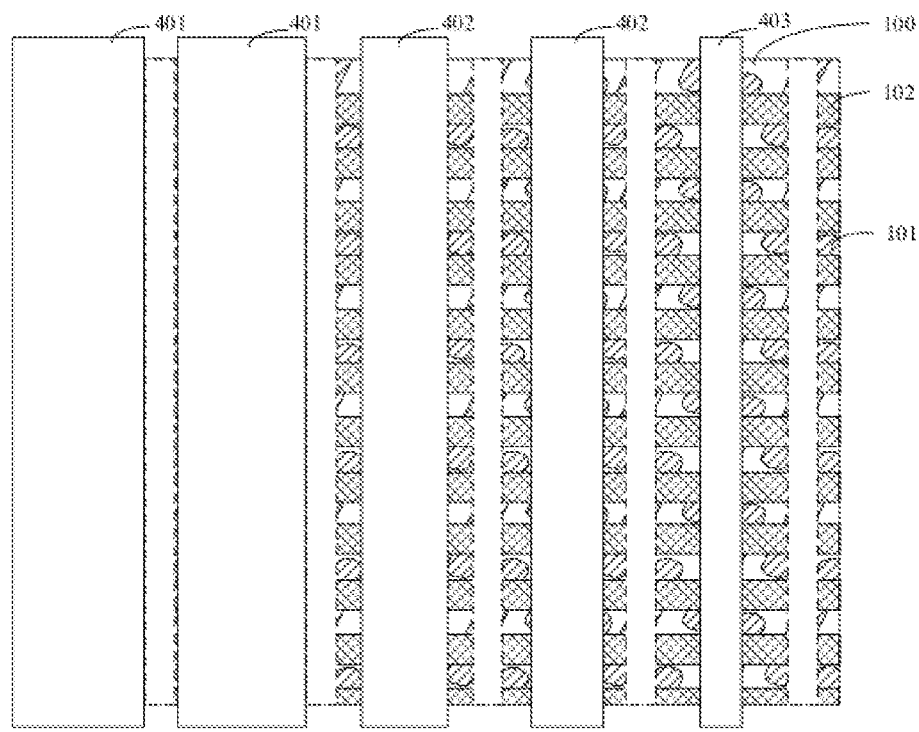
FIG. 7 illustrates a schematic structural diagrams of one embodiment corresponding to steps of a memory forming method.

Referring to FIG. 7, FIG. 7 shows positions of three kinds of patterns 131 arranged at intervals formed by patterning the photolithographic mask layers 130 based on the photoresists 140, which are specifically as follows:

Positions of the first kind of patterns 131 arranged at intervals: Patterns I 401 only expose positions where bit line structures are required to be subsequently formed.

In some embodiments, the patterns I 401 cover at least one position where bit line structures are required to be subsequently formed and completely cover gaps between the bit line structures, only a position where at least one bit line structure is required to be subsequently formed is exposed between adjacent patterns I 401, and the bit line structures covered by the patterns I 401 and the bit line structures not covered by the patterns I 401 are arranged alternately in the extension direction 10 of the word line structures.

Positions of the second kind of patterns 131 arranged at intervals: Patterns II 402 cover at least one bit line structure and positions of gaps between part of the bit line structures.

In some embodiments, the patterns II 402 cover at least one position where bit line structures are required to be subsequently formed and completely cover gaps between part of the bit line structures, only a position where at least one bit line structure is required to be subsequently formed and the gaps between part of the bit line structures are exposed between adjacent patterns II 402, and the bit line structures covered by the patterns II 402 and the bit line structures not covered by the patterns II 402 are arranged alternately in the extension direction 10 of the word line structures.

Positions of the third kind of patterns 131 arranged at intervals: Patterns III 403 cover only a position of at least one bit line structure.

In some embodiments, the patterns III 403 cover at least one position where bit line structures are required to be subsequently formed, only gaps between the bit line structures and a position where at least one bit line structure is required to be subsequently formed are exposed between adjacent patterns III 403, and the bit line structures covered by the patterns III 403 and the bit line structures not covered by the patterns III 403 are arranged alternately in the extension direction 10 of the word line structures.

Figure 8:
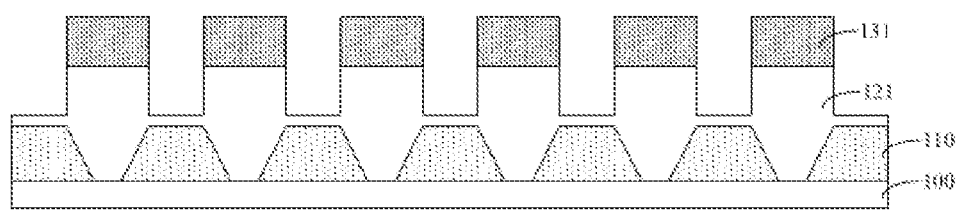
FIG. 8 illustrates a schematic structural diagrams of one embodiment corresponding to steps of a memory forming method.

Referring to FIG. 8, part of the bit line contact layers 120 are etched based on the patterns 131 arranged at intervals to form bit line contact layers 121 of different heights.

Figure 9:
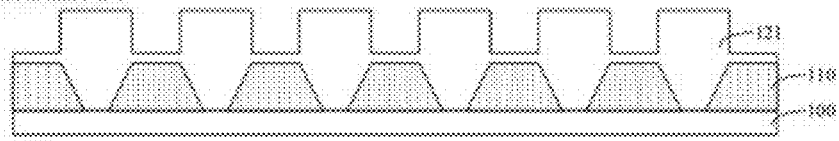
FIG. 9 illustrates a schematic structural diagrams of one embodiment corresponding to steps of a memory forming method.
Figure 9:
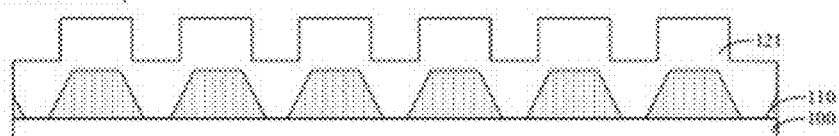

Referring to FIG. 9, the patterns 131 arranged at intervals are removed.

Directions of the dashed line 30 and the dashed line 31 in the figure are two section positions shown in FIG. 3, for those skilled in the art to understand the principle of the present application.

FIG. 9 shows a schematic cross-sectional view in directions of the dashed line 30 and the dashed line 31. The bit line contact layers 121 are at the same height in a direction perpendicular to the extension direction 10 of the word line structures (the same vertical position of the two figures). In the extension direction 10 of the word line structures (section direction illustrated), the bit line contact layers 121 are at different heights, and convex portions at the first height and concave parts at the second height are arranged alternately.

In other embodiments, masks may also be continuously formed to further etch the bit line contact layers of different heights, so that the heights of top surfaces of the remaining bit line contact layers may be arranged alternately in a preset height order.

Figure 10:
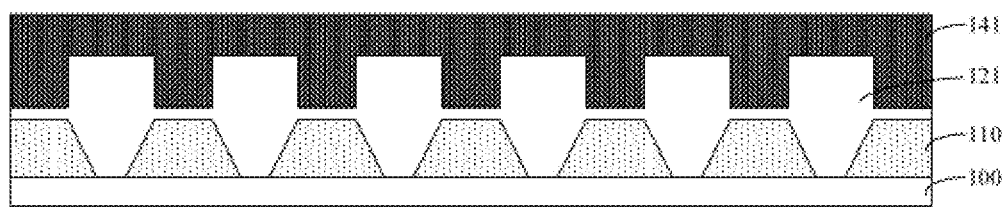
FIG. 10 illustrates a schematic structural diagrams of one embodiment corresponding to steps of a memory forming method.
Figure 11:
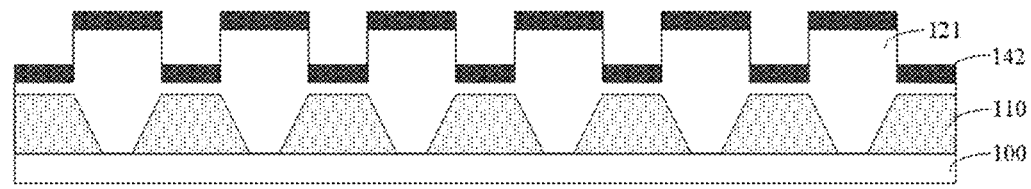
FIG. 11 illustrates a schematic structural diagrams of one embodiment corresponding to steps of a memory forming method.

Referring to FIG. 10 and FIG. 11, conductive layers 142 are formed on top surfaces of the bit line contact layers 121 at different heights.

In some embodiments, referring to FIG. 10, conductive films 141 may be formed on top surfaces of the bit line contact layers 121 at different heights.

Referring to FIG. 11, the conductive films 141 (refer to FIG. 10) may be etched to form conductive layers 142 with a uniform thickness on the top surfaces of the bit line contact layers 121 at different heights. The conductive layers 142 on the top surfaces of the bit line contact layers 121 at different heights are ensured to be at different heights by forming the conductive layers 142 with a uniform thickness.

In other embodiments, the thicknesses of the conductive layers on the top surfaces of the bit line contact layers at different heights may be different, but this needs to ensure that a connecting line of the conductive layers between different bit line structures is oblique, thus increasing the spacing of the conductive layers between the bit line structures on the basis of not changing the arrangement of the bit line structures.

Top surfaces of the formed conductive layers 142 are at the same height in a direction perpendicular to the extension direction 10 of the word line structures; and the top surfaces are at different heights in the extension direction 10 of the word line structures.

In some embodiment, the conductive layers 142 are formed from one conductive material or multiple conductive materials, such as doped polysilicon, titanium, titanium nitride, tungsten, and tungsten compounds.

Figure 12:
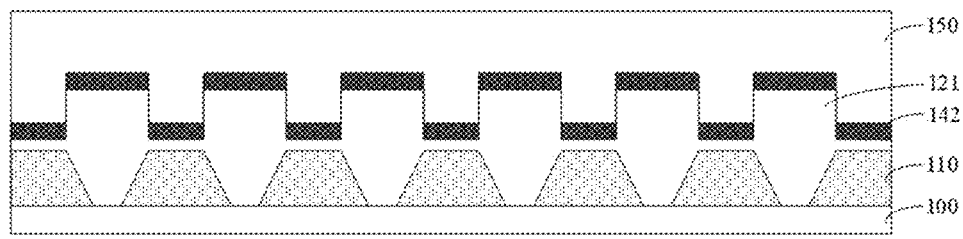
FIG. 12 illustrates a schematic structural diagrams of one embodiment corresponding to steps of a memory forming method.

Referring to FIG. 12, top dielectric layers 150 are formed on the top surfaces of the conductive layers 142.

In some embodiments, top dielectric films are formed on the top surfaces of the conductive layers, top surfaces of the top dielectric films are planarized to form the top dielectric layers 150, and top surfaces of the top dielectric layers 150 are at a uniform height.

In some embodiments, the top surfaces of the top dielectric films are planarized by chemical mechanical polishing. Compared with etching, chemical mechanical polishing has a higher removal rate, which is conducive to shortening a process cycle.

In some embodiments, the material of the top dielectric layers 150 includes silicon nitride, silicon nitride, silicon oxide, or other materials. In some embodiments, the top dielectric layers 150 are made of a nitrogen-containing insulating material, that is, the top dielectric layers 150 are made of a silicon nitride material.

Figure 13:
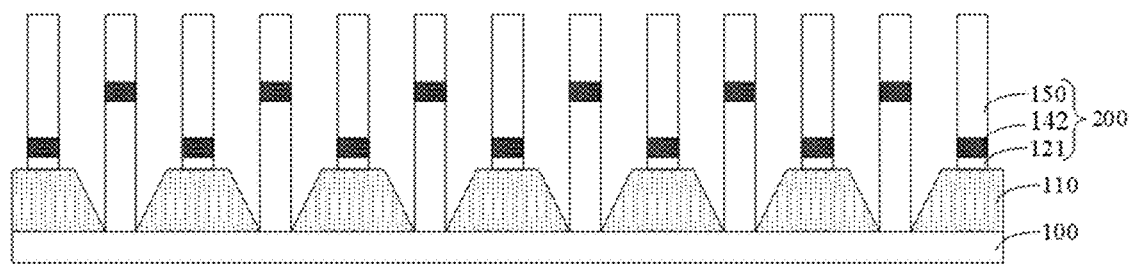
FIG. 13 is a schematic cross-sectional view of a memory formed according to the first embodiment of the present application.
Figure 13:
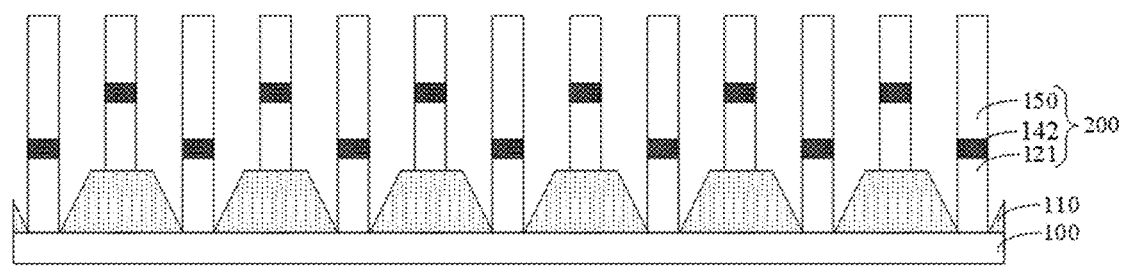

Referring to FIG. 13, part of the top dielectric layers 150, the conductive layers 142, and the bit line contact layers 121 are sequentially etched to form discrete bit line structures 200.

A connecting line of the conductive layers 142 in the discrete bit line structures 200 is straight in the direction perpendicular to the extension direction 10 of the word line structure, and conductive layers 140 in adjacent discrete bit line structures 200 are at different heights in the extension direction 10 of the word line structures.

The division of the above steps is only for clear illustration. In implementation, the steps may be combined into one step or some steps may be split into a plurality of steps. These steps, as long as observing the same logical relationship, all fall within the protection scope of the present patent. Any non-mandatory modifications added to the flow or any optional designs introduced to the same shall fall within the protection scope of the patent provided that the core design of the procedures is not changed.

Embodiments relate to a memory are also described herein.

Referring to FIG. 13, the memory according to the present embodiment will be described in detail below with reference to the drawings, and the parts the same as or corresponding to the first embodiment will not be described in detail below.

The memory includes: a substrate 100 including at least word line structures 102 and active regions 101; bottom dielectric layers 110 located at the top of the substrate 100, the bottom dielectric layers 110 having bit line contact openings 111 exposing the active regions 101 in the substrate; and discrete bit line structures 200, top surfaces of the bit line structures 200 being at the same height, and the bit line structures 200 including: bit line contact layers 121 located at the top of the bottom dielectric layers 110 and the bit line contact openings 111, conductive layers 140 located at the top of the bit line contact layers 121, and top dielectric layers 150 located at the top of the conductive layers 142; wherein the conductive layers 142 in the same bit line structure are at the same height in an extension direction 20 of the bit line structures, and the conductive layers 142 in adjacent bit line structures are at different heights in the extension direction 10 of the word line structures.

In other embodiments, the substrate 100 may further include other memory structures in addition to the word line structures 102 and the active regions 101, such as shallow trench isolation structures. Since the other memory structures do not involve the core technology of the present application, they are not described in detail herein. Those skilled in the art can understand that the substrate 100 further includes other memory structures in addition to the word line structures 102 and the active regions 101, which are used for normal operation of a memory.

In some embodiments, the thicknesses of the conductive layers 142 are uniform. In other embodiments, the thicknesses of the conductive layers 142 on the top surfaces of the bit line contact layers 121 at different heights may be different, but this needs to ensure that the top surfaces of the conductive layers 142 are at different heights, so that a connecting line of the conductive layers between different bit line structures is oblique, thus increasing the spacing of the conductive layers between the bit line structures on the basis of not changing the arrangement of the bit line structures.

In some embodiments, in the extension direction of the bit line structures, the connecting line of the conductive layers 142 is straight, that is, in the same bit line structure 200, the conductive layers 142 are at the same height (the same height at the bottom and the same height at the top).

In some embodiments, the conductive layers 142 at the first height and the conductive layers 142 at the second height are arranged alternately in the extension direction 10 of the word line structures. In other embodiments, the conductive layers 142 may be arranged alternately in a preset height order.

Since the embodiment of the forming method corresponds to the embodiment of the memory, the memory embodiment and the forming method embodiment can cooperate with each other. The relevant technical details mentioned in the forming method embodiment are still valid in the memory embodiment, and the technical effects that can be achieved in the forming method embodiment can also be realized in the memory embodiment. Details are not described herein again to reduce repetition. Accordingly, the related technical details mentioned in the memory embodiment can also be applied to the forming method embodiment.

Those of ordinary skill in the art may understand that the above embodiments are specific embodiments for implementing the present application. In practical applications, various changes may be made to the forms and details of these embodiments without departing from the spirit and scope of the present application. The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not limited to the method and memory described herein, but is to be accorded the broadest scope consistent with the principles and novel features disclosed herein.

What is claimed is:

1. A memory forming method, comprising:
providing a substrate comprising at least word line structures and active regions, and bottom dielectric layers and bit line contact layers located on a top surface of the substrate, the bottom dielectric layers having bit line contact openings exposing the active regions in the substrate, and the bit line contact layers covering the bottom dielectric layers and filling the bit line contact openings;
etching part of the bit line contact layers to form bit line contact layers of different heights;
forming conductive layers on top surfaces of the bit line contact layers of different heights, the conductive layers in a same bit line structure are at a same height at all positions in an extension direction of the bit line structures, a connecting line of the conductive layers in the same bit line structure is straight in the extension direction of the bit line structure; and the conductive layers in adjacent bit line structures are at different heights at all positions in an extension direction of the word line structures;
forming top dielectric layers on the top surfaces of the conductive layers; and
sequentially etching part of the top dielectric layers, the conductive layers, and the bit line contact layers to form discrete bit line structures.

2. The memory forming method according to claim 1, wherein
the step of etching part of the bit line contact layers to form the bit line contact layers of different heights comprises:
forming photolithographic mask layers on top surfaces of the bit line contact layers;
patterning the photolithographic mask layers, and forming patterns arranged at intervals in the direction perpendicular to the extension direction of the word line structures;
etching part of the bit line contact layers based on the patterns arranged at intervals to form the bit line contact layers of different heights; and
removing the patterns arranged at intervals.

3. The memory forming method according to claim 2, wherein
the patterns arranged at intervals are extended strips arranged at intervals.

4. The memory forming method according to claim 1, wherein
after the step of sequentially etching part of the top dielectric layers, the conductive layers, and the bit line contact layers to form discrete bit line structures, and conductive layers in adjacent discrete bit line structures are at different heights in the extension direction of the word line structure.

5. The memory forming method according to claim 1, wherein the step of forming conductive layers on top surfaces of the bit line contact layers comprises:

forming conductive films on the top surfaces of the bit line contact layers; and etching the conductive films to form the conductive layers with a uniform thickness on the top surfaces of the bit line contact layers at different heights.

6. The memory forming method according to claim 1, wherein the step of forming top dielectric layers on the top surfaces of the conductive layers comprises:

forming top dielectric films on the top surfaces of the conductive layers; and planarizing top surfaces of the top dielectric films to form the top dielectric layers, top surfaces of the top dielectric layers being at a uniform height.

* * * * *